(12) United States Patent
Whittington et al.

(10) Patent No.: US 9,160,313 B2
(45) Date of Patent: Oct. 13, 2015

(54) COMPENSATED TEMPERATURE VARIABLE RESISTOR

(71) Applicant: NATIONAL INSTRUMENTS CORPORATION, Austin, TX (US)

(72) Inventors: Mark Whittington, Austin, TX (US); Mohammadreza Samadiboroujeni, Austin, TX (US)

(73) Assignee: National Instruments Corporation, Austin, TX (US)

( * ) Notice: Subject to any disclaimer, the term of this patent is extended or adjusted under 35 U.S.C. 154(b) by 142 days.

(21) Appl. No.: 14/080,053

(22) Filed: Nov. 14, 2013

(65) Prior Publication Data

US 2015/0130526 A1  May 14, 2015

(51) Int. Cl.
*H03K 3/011* (2006.01)
*H03K 5/003* (2006.01)

(52) U.S. Cl.
CPC ............. *H03K 3/011* (2013.01); *H03K 5/003* (2013.01)

(58) Field of Classification Search
USPC ............... 327/307–308, 318–319, 327–328, 327/512–513, 538, 543, 560
See application file for complete search history.

(56) References Cited

U.S. PATENT DOCUMENTS

| | | | |
|---|---|---|---|
| 4,622,476 A | 11/1986 | Venkatesh | |
| 4,980,656 A | 12/1990 | Duffalo | |
| 5,726,564 A | 3/1998 | Takashima | |
| 5,898,321 A | 4/1999 | Ilkbahar | |
| 6,472,942 B1 | 10/2002 | Lauffenburger | |
| 6,492,709 B2 | 12/2002 | Olson | |
| 6,600,384 B2 | 7/2003 | Mohwinkel | |
| 6,646,539 B2 | 11/2003 | Bloch | |
| 6,720,828 B2 | 4/2004 | Nelson | |
| 7,253,074 B2 | 8/2007 | Park | |
| 7,432,758 B2 * | 10/2008 | Chou et al. | 327/540 |
| 7,714,694 B2 | 5/2010 | Landsberger | |
| 8,416,023 B2 | 4/2013 | Rijs | |
| 8,446,209 B1 * | 5/2013 | Horsky et al. | 327/513 |
| 8,878,621 B2 | 11/2014 | Matsuzaki | |

OTHER PUBLICATIONS

Montree Kumngern, Usa Torteanchai, Kobchai Dejhan; "Voltage-Controlled Floating Resistor Using DDCC" Radioengineering, vol. 20, No. 1, Apr. 2011, pp. 327-333 (7 pages).

* cited by examiner

*Primary Examiner* — An Luu
(74) *Attorney, Agent, or Firm* — Meyertons Hood Kivlin Kowert & Goetzel, P.C.; Jeffrey C. Hood

(57) ABSTRACT

A front-end circuit for measurement devices, for example oscilloscopes or digitizers, may implement DC gain compensation using a programmable variable resistance. A MOS transistor may be configured and operated as a linear resistor with the ability to self-calibrate quickly, while compensating for temperature variations. An integrated CMOS-based variable resistor may be thereby used for an analog adjustable attenuator. Master and slave CMOS transistors may be operated in linear mode, and temperature effects on the linear transistors may be compensated for by using an integral loop controller (current controller) configured around the master MOS transistor. Circuits implemented with the compensated variable resistance have a wide range of adjustment with a control voltage, and may be used in the front-end (circuits) of an oscilloscope or digitizer, or in any other circuit and/or instrumentation benefitting from an adjustable attenuator.

20 Claims, 4 Drawing Sheets

COMPENSATED TEMPERATURE VARIABLE RESISTOR

FIELD OF THE INVENTION

The present invention relates to the field of instrumentation, and more particularly to the design of a compensated temperature variable resistor.

DESCRIPTION OF THE RELATED ART

In many industrial applications (and others), instruments collect data or information from an environment or unit under test (UUT), and may also analyze and process acquired data. Some instruments provide test stimuli to a UUT. Examples of instruments include oscilloscopes, digital multimeters, pressure sensors, arbitrary waveform generators, digital waveform generators, etc. The information that may be collected by respective instruments includes information describing voltage, resistance, distance, velocity, pressure, oscillation frequency, humidity, and/or temperature, among others. Computer-based instrumentation systems typically include transducers for capturing a physical phenomenon and generating a representative electrical signal, signal conditioning logic to perform amplification on the electrical signal, isolation, and/or filtering, and analog-to-digital (A/D) conversion logic for receiving analog signals and providing corresponding digital signals to the host computer system.

In a computer-based system, the instrumentation hardware or device is typically an expansion board plugged into one of the I/O slots of the computer system. In another common instrumentation system configuration, the instrumentation hardware is coupled to the computer system via other means such as through a VXI (VME extensions for Instrumentation) bus, a GPIB (General Purpose Interface Bus), a PXI (PCI extensions for Instrumentation) bus, Ethernet, a serial port or bus, or parallel port of the computer system. The instrumentation hardware may include a DAQ (Data Acquisition) board, a computer-based instrument such as a multimeter, or another type of instrumentation device. In another common system configuration, a chassis and boards inserted in the chassis may operate as a standalone instrument or instrument suite, although in some cases a host computer may be used to configure or program the boards prior to, or during operation.

The instrumentation hardware may be configured and controlled by software executing on a host computer system coupled to the system, or by a controller card installed in the chassis. The software for configuring and controlling the instrumentation system typically includes driver software and the instrumentation application software, or the application. The driver software serves to interface the instrumentation hardware to the application and is typically supplied by the manufacturer of the instrumentation hardware or by a third party software vendor. The application is typically developed by the user of the instrumentation system and is tailored to the particular function that the user intends the instrumentation system to perform. The instrumentation hardware manufacturer or third party software vendor sometimes supplies application software for applications that are common, generic, or straightforward. Instrumentation driver software provides a high-level interface to the operations of the instrumentation device. The instrumentation driver software may operate to configure the instrumentation device for communication with the host system and to initialize hardware and software to a known state. The instrumentation driver software may also maintain a soft copy of the state of the instrument and initiated operations. Further, the instrumentation driver software communicates over the bus to move the device from state to state and to respond to device requests.

The accuracy of the electronic components used in common measurement devices or instruments, for example in oscilloscopes, can vary. Since most electrical components have a temperature coefficient, they are typically affected by temperature variations. Values of various characteristics of those electronic components typically drift over time and over temperature. As time progresses, or as the surrounding temperature varies, changes in component values can easily result in greater uncertainty and measurement errors. For example, when an electrical component such as a resistor has a Positive Temperature Coefficient (PTC), that resistor experiences an increase in electrical resistance as its temperature increases. The higher the coefficient, the greater the increase in electrical resistance for a given increase in temperature. In contrast, when a resistor has a negative temperature coefficient (NTC), its conductivity rises with increasing temperature, typically within a defined temperature range.

The front-end circuit of an oscilloscope or a digitizer is generally associated with matching, amplification and attenuation for coupling an input signal to an electronic test and measurement circuit without loading effects on the device under test (DUT). The standard input resistance is typically 1 MΩ (Mega Ohm) and the input capacitance is typically a low value between 10 pF (Pico Farads) and 30 pF. The attenuation in front-end circuits is commonly implemented through the use of compensated attenuators. A compensated attenuator typically includes a resistive voltage divider connected in parallel with a capacitive voltage divider. The ratio of the resistance value is expected to match the ratio of the capacitance value for a flat frequency response. In some modern implementations these ratios are adjusted electronically. One example of such an implementation is shown in FIG. 3, which illustrates a front-end circuit that includes feedback amplifier 210, resistors 202 and 204, capacitors 206 and 208, with a variable gain amplifier 212 in series with resistor 204 for DC gain implementation. The variable gain amplifier 212 is used to set the DC gain equal to the AC gain of $-(C_1/C_2)$. While a variable gain amplifier can be implemented with less area, more flexibility, and at a reduced cost, there remain some drawbacks. First, using an active circuit in an application susceptible to temperature variation results in DC offset and drifts. Second, required calibration for the instrument can become costly as it may require complex circuitry that occupies a sizable area. Finally, using a variable gain amplifier reduces linearity performance at low frequencies.

Other corresponding issues related to the prior art will become apparent to one skilled in the art after comparing such prior art with the present invention as described herein.

SUMMARY OF THE INVENTION

Various embodiments of a front-end circuit for measurement devices, for example oscilloscopes, may implement DC gain compensation using a programmable variable resistance. A MOS transistor may be configured and operated as a linear resistor with the ability to self-calibrate quickly, while compensating for temperature variations. Various embodiments of a circuit described herein utilize an integrated CMOS-based variable resistor for an analog adjustable attenuator. The circuit may operate master and slave MOS transistors in linear mode, and compensate for temperature effects on the linear transistors by using an integral loop controller (current controller) configured around the master MOS transistor. Embodiments of this novel attenuator circuit have a wide range of adjustment with a control voltage for use in the front-end (circuits) of an oscilloscope or digitizer, or any other circuit and/or instrumentation benefitting from an adjustable attenuator. Furthermore, embodiments of the compensated temperature variable resistor may be used in other applications as well, where such resistors or resistances may be beneficial or required.

A variable resistance in the feedback path of an inverting amplifier circuit may be used to adjust time constants. The AC gain may be defined by the ratio of the respective values of a pair of capacitors ($-C_1/C_2$) each having a respective terminal coupled to a common node, with the remaining terminal of the first capacitor ($C_1$) coupled to the input terminal (node) of the front-end circuit, and the remaining terminal of the second capacitor ($C_2$) coupled to the output of a feedback amplifier. The DC gain may be defined by a resistor network having four terminals and including a variable resistance, a first terminal coupled to the output of the feedback amplifier, a second terminal coupled to an input of the feedback amplifier, a third terminal coupled to the input terminal of the front-end circuit, and a fourth terminal coupled to a voltage reference. The variable resistance may be implemented using a MOS transistor operating in triode mode, that is, in the linear region (also referred to as ohmic mode). A control circuit may be used to monitor and control the value of the variable resistance by way of a control loop, with a replica of the variable resistance used in the main signal path of the front-end circuit. Therefore, $R_{Vm}$ and $R_{Vr}$ may represent the equivalent resistance values, respectively, of a master linear transistor within the control circuit (in the control loop) and a replica transistor within the main signal path. As the resistance value $R_{Vm}$ drifts away from a specified resistance value due to temperature change, its gate to source bias voltage ($V_{GS}$) may be adjusted by the control loop to return it to the specified value.

The specified (predetermined) resistance value may be set by a current reference value $I_{ref}$ and a voltage reference value $V_{ref}$. Accordingly, in one set of embodiments, the specified resistance value may simply be established as $V_{ref}/I_{ref}$. At equilibrium, the drop voltage across $R_{Vm}$ produced by $I_{ref}$ is equal to the reference voltage ($V_{ref}$). An integrator stage, used within the control circuit to control the resistance value $R_{Vm}$, may enforce this condition through negative feedback. The integrator stage may be operated to have its output voltage change only when there is an input error current equal to ($V_{ref}/R_{Vm}-I_{ref}$). The error current may drop to a specified value, e.g. zero Amps, as a desired condition is reached, e.g. $V_{ref}/R_{Vm}=I_{ref}$. It should be noted that an objective is to keep the main signal path gain controlling resistance $R_{Vr}$ constant with temperature. When $R_{Vr}$ and $R_{Vm}$ are identical to one another and $R_{Vr}$ is under control of $R_{Vm}$, by dynamically adjusting $R_{Vm}$ to keep it constant with respect to changes in temperature, the control loop may also ensure that the value $R_{Vr}$ also remains constant with respect to changes in temperature.

Accordingly, in various embodiments, a resistance circuit may include a first transistor device operating in linear mode and having an operative resistance value representative of a specified nominal resistance value, and may further include a second transistor device having device characteristics commensurate with characteristics of the first transistor device, with the second transistor device also operating in linear mode and having an operative resistance value representative of the specified nominal resistance value. The resistance circuit may use control circuitry to cause the operative resistance value of the second transistor device to return to the specified nominal resistance value when the operative resistance value drifts away from the specified nominal resistance value due to changes in temperature. The control circuitry may further control the first transistor device by a control signal generated according to operation of the second transistor device, causing the operative resistance value of the first transistor device to return to the specified nominal resistance value when the operative resistance value of the first transistor device drifts away from the specified nominal resistance value due to changes in temperature.

In one embodiment, the control circuit may adjust a gate-source bias voltage of the second transistor device to cause the operative resistance value of the second transistor device to return to the specified nominal resistance value. Furthermore, the operative resistance value of the second transistor device may be determined by a ratio of a reference voltage and a reference current applied at respective terminals of the second transistor device. During an equilibrium condition, a drop voltage produced by the reference current across the channel of the second transistor device equals the reference voltage applied to a channel terminal of the second transistor device. The control circuit may include an integrator stage that enforces the equilibrium condition through negative feedback to the second transistor device. The integrator stage may adjust the gate-source bias voltage of the second transistor device when an input error current into the integrator stage reaches a specified value.

Therefore, a method for compensating a DC gain in a front-end circuit may include operating a first transistor device in linear mode, with the first transistor device having an operative resistance value representative of a specified nominal resistance value, and the first transistor device placed in a feedback path of an inverting amplifier circuit of the front-end circuit. The method may further include operating a second transistor device in linear mode—with the second transistor device having an operative resistance value representative of the specified nominal resistance value—and causing the operative resistance value of the second transistor device to return to the specified nominal resistance value when the operative resistance value of the second transistor device drifts away from the specified nominal resistance value due to changes in temperature. By slaving the first transistor device to the second transistor device, this results in causing the operative resistance value of the first transistor device to return to the specified nominal resistance value when the operative resistance value of the first transistor device drifts away from the specified nominal resistance value due to changes in temperature. The first transistor device may be controlled by a control signal generated based on operation of the second transistor device.

Causing the operative resistance value of the second transistor device to return to the specified nominal resistance value may be achieved by adjusting a gate-source bias voltage of the second transistor device, and the operative resistance value of the second transistor device may be set by applying a reference current and a reference voltage at respective terminals of the second transistor device, with the operative resistance value of the second transistor device determined by a ratio of the reference voltage and the reference current. Accordingly, the method may include producing, by the reference current, a drop voltage across the second transistor device, and applying the reference voltage to a channel terminal of the second transistor device, where during an equilibrium condition the drop voltage equals the reference voltage, and the equilibrium condition is enforced through an integrating, negative feedback path to the second transistor device, which includes adjusting a gate-source bias voltage of the second transistor device when an error current into the integrating, negative feedback path reaches a specified value.

Other aspects of the present invention will become apparent with reference to the drawings and detailed description of the drawings that follow.

BRIEF DESCRIPTION OF THE DRAWINGS

A better understanding of the present invention can be obtained when the following detailed description of the preferred embodiment is considered in conjunction with the following drawings, in which.

Figure 1:
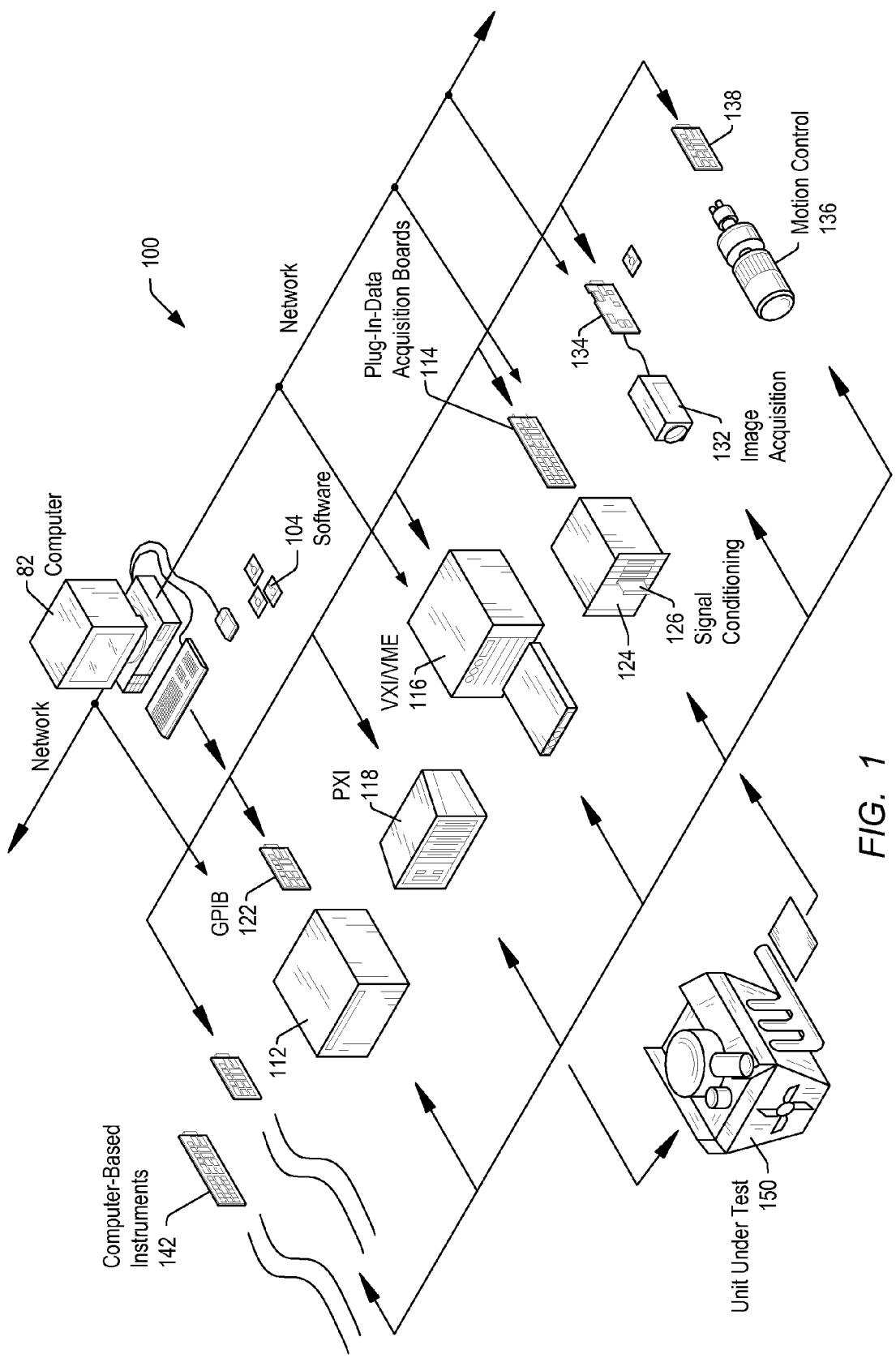
FIG. 1 shows an instrumentation control system with instruments networked together according to one embodiment of the invention.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE EMBODIMENTS

Embodiments of a front-end circuit with an adjustable attenuator described herein may be used in systems configured to perform test and/or measurement functions, to control and/or model instrumentation or industrial automation hardware, or to model and simulate functions, e.g., modeling or simulating a device or product being developed or tested, etc. More specifically, they may be used in various instances where a front-end circuit for instrumentation/measurement equipment is required, without degrading the performance and accuracy of the measurements. However, it is noted that various embodiments may equally be used for a variety of applications, and such applications are not intended to be limited to those enumerated above. In other words, applications discussed in the present description are exemplary only, and various embodiments of front-end circuits including an adjustable attenuator may be used in any of various types of systems.

FIG. 1 illustrates an exemplary instrumentation control system 100 which may be configured according to embodiments of the present invention. System 100 comprises a host computer 82 which may couple to one or more instruments configured to perform a variety of functions using timing control implemented according to various embodiments of the present invention. Host computer 82 may comprise a CPU, a display screen, memory, and one or more input devices such as a mouse or keyboard as shown. Computer 82 may operate with one or more instruments to analyze, measure, or control a unit under test (UUT) or process 150. The one or more instruments may include a GPIB instrument 112 and associated GPIB interface card 122, a data acquisition board 114 inserted into or otherwise coupled with chassis 124 with associated signal conditioning circuitry 126, a VXI instrument 116, a PXI instrument 118, a video device or camera 132 and associated image acquisition (or machine vision) card 134, a motion control device 136 and associated motion control interface card 138, and/or one or more computer based instrument cards 142, among other types of devices.

The computer system may couple to and operate with one or more of these instruments. In some embodiments, the computer system may be coupled to one or more of these instruments via a network connection, such as an Ethernet connection, for example, which may facilitate running a high-level synchronization protocol between the computer system and the coupled instruments. The instruments may be coupled to the unit under test (UUT) or process 150, or may be coupled to receive field signals, typically generated by transducers. System 100 may be used in a data acquisition and control applications, in a test and measurement application, an image processing or machine vision application, a process control application, a man-machine interface application, a simulation application, or a hardware-in-the-loop validation application, among others.

Figure 2:
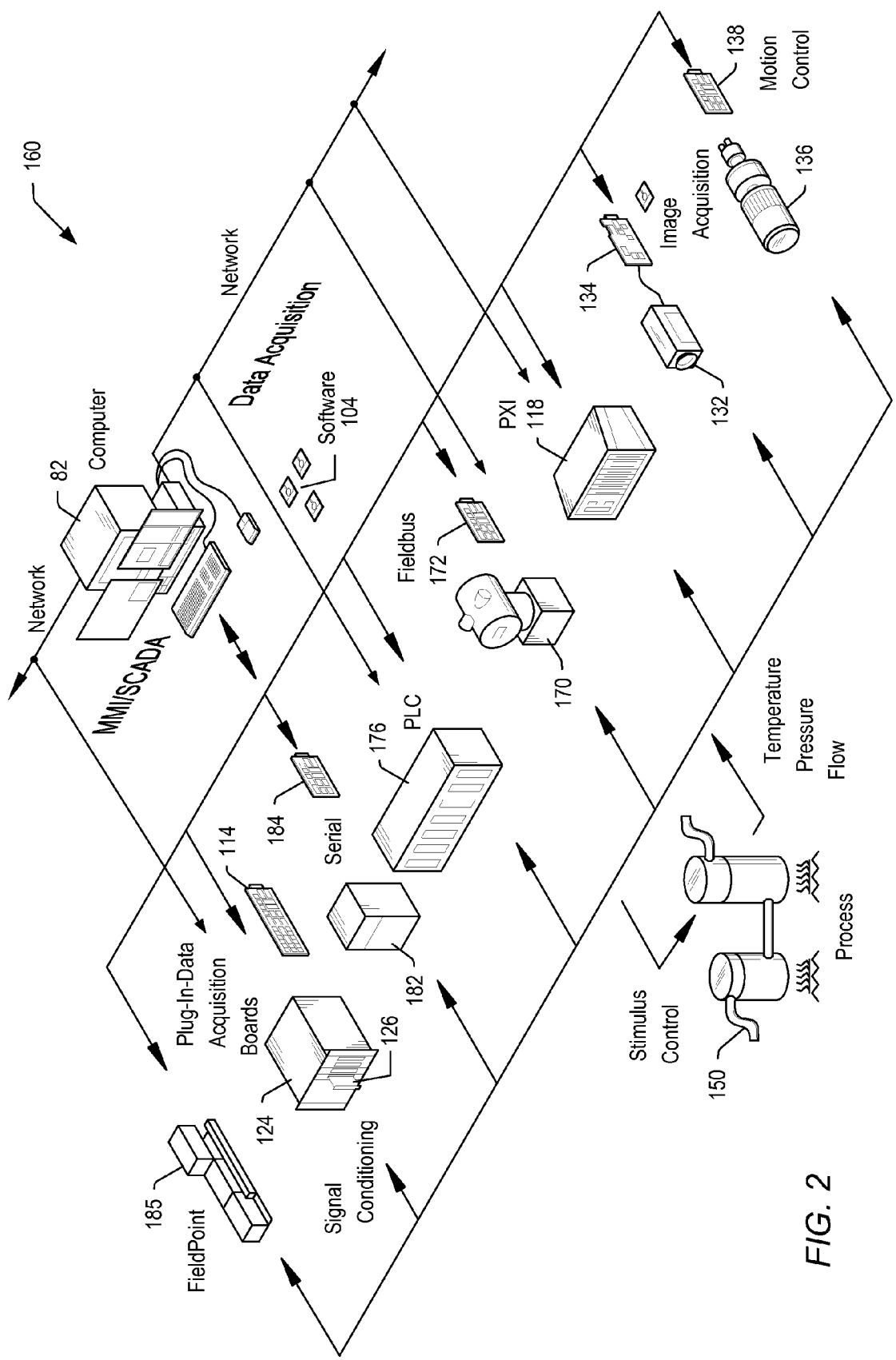
FIG. 2 shows an industrial automation system with instruments networked together according to one embodiment of the invention.
Figure 3:
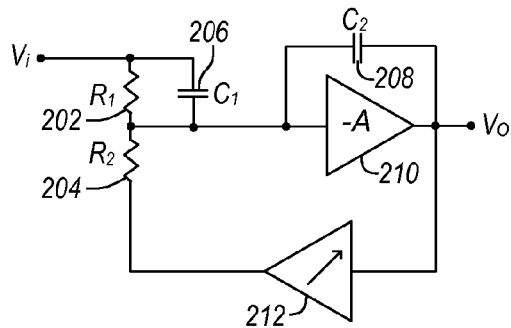
FIG. 3 shows a front-end circuit for an oscilloscope or digitizer, using a variable gain amplifier, according to prior art.

FIG. 2 illustrates an exemplary industrial automation system 160 that may be configured according to embodiments of the present invention. Industrial automation system 160 may be similar to instrumentation or test and measurement system 100 shown in FIG. 2. Elements that are similar or identical to elements in FIG. 1 have the same reference numerals for convenience. System 160 may comprise a computer 82 which may couple to one or more devices and/or instruments configured to perform a variety of functions using timing control implemented according to various embodiments of the present invention. Computer 82 may comprise a CPU, a display screen, memory, and one or more input devices such as a mouse or keyboard as shown. Computer 82 may operate with the one or more devices and/or instruments to perform an automation function, such as MMI (Man Machine Interface), SCADA (Supervisory Control and Data Acquisition), portable or distributed data acquisition, process control, and advanced analysis, among others, on process or device 150.

The one or more devices may include a data acquisition board 114 inserted into or otherwise coupled with chassis 124 with associated signal conditioning circuitry 126, a PXI instrument 118, a video device 132 and associated image acquisition card 134, a motion control device 136 and associated motion control interface card 138, a field bus device 170 and associated field bus interface card 172, a PLC (Programmable Logic Controller) 176, a serial instrument 182 and associated serial interface card 184, or a distributed data acquisition system, such as the Compact FieldPoint or CompactRIO systems available from National Instruments, among other types of devices. In some embodiments, similar to the system shown in FIG. 1, the computer system may couple to one or more of the instruments/devices via a network connection, such as an Ethernet connection.

Figure 4:
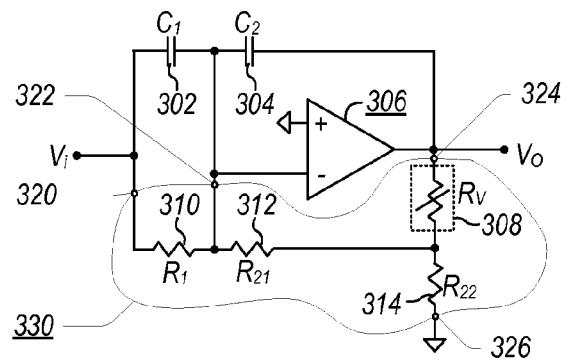
FIG. 4 shows one embodiment of front-end circuit for an oscilloscope or digitizer, using a compensated temperature variable resistor.

FIG. 4 illustrates one embodiment of a front-end circuit with an adjustable attenuator. The front-end circuit shown in FIG. 4 may be used with a measuring instrument or device, for example an oscilloscope or a digitizer, or a variety of other devices that may benefit from receiving attenuated input signals. In other words, the front-end circuit may be used to provide the input signals to measuring instruments/equipment, such as an oscilloscope or digitizer that may be configured in a system such as the one shown in FIG. 1 and/or FIG. 2. In the embodiment shown in FIG. 4, a resistor network 330 may be used to adjust the DC gain for the circuit. Resistor network 330 includes resistors 310, 312, 314, and compensated temperature variable resistance (or resistor) 308, and has four terminals 320, 322, 324 and 326 coupling to various nodes of the circuit as shown. The variable resistance in the feedback of the inverting amplifier circuit—which includes amplifier 306 and capacitors 302 and 304 (indicated as having values of $C_1$ and $C_2$, respectively)—is used to adjust the time constants. The AC gain is defined by capacitors 302 and 304, and more specifically expressed by the equation:

$$\text{Gain}_{AC} = -C_1/C_2. \quad (1)$$

The DC gain, defined by resistor network 330, is more specifically expressed by the equation:

$$\text{Gain}_{DC} = -(R_{21}/R_1)(1+R_V/R_{21}+R_V/R_{22}).$$

The variable resistance 308 (indicated as having a nominal value of $R_V$) may be implemented using a MOS transistor operating in triode mode, that is, operated in the linear region.

Figure 5:
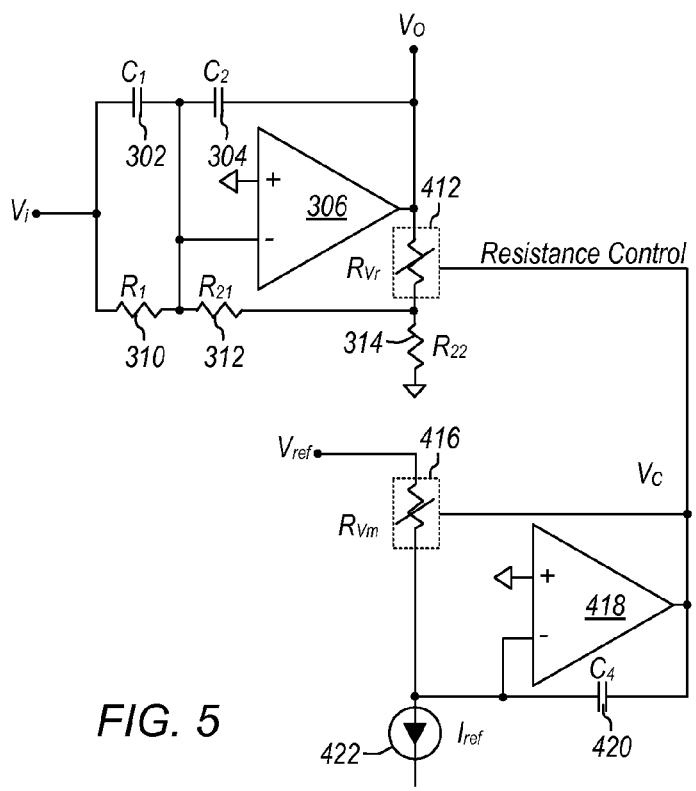
FIG. 5 shows one embodiment of the front-end circuit of FIG. 4, using a control circuit for controlling the variable resistor.

Variable resistance 308 may be implemented to have an adjustable, or compensated value. In one set of embodiments, the value of a variable resistance may be monitored in a control loop, while a replica of the variable resistance is used in the main signal path. FIG. 5 shows a circuit block diagram of the front-end circuit from FIG. 4, including one embodiment of a resistance control circuit and a compensated temperature variable resistance. As shown in FIG. 5, the resistance control circuit may include a temperature variable resistance (TVR) 416, a reference current source 422, a feedback (control loop) amplifier 418, and a feedback capacitor 420. The respective values $R_{Vm}$ and $R_{Vr}$ for TVR 416 and TVR 412 are the equivalent resistance values of a master linear transistor and of a replica transistor, respectively. That is, TVR 416 may be implemented using a transistor (e.g. a CMOS device) operated as a master transistor in the linear region, and TVR 412 may be implemented using a transistor operated as a slave transistor also in the linear region. As the resistance value $R_{Vm}$ of TVR 416 tends to drift away from a specified (predetermined) resistance value due to changes in temperature, its gate to source bias voltage ($V_{GS}$) may be adjusted by a control loop to bring the resistance value back to the specified value.

The specified resistance value may be set by a current reference value, $I_{ref}$ provided by reference current source 422, and a voltage reference value, $V_{ref}$ that may be provided by a suitable voltage reference circuit (not shown in FIG. 5). The specified resistance value may be defined as:

$$R = V_{ref}/I_{ref} \quad (3)$$

At equilibrium, the drop voltage across $R_{Vm}$ produced by $I_{ref}$ is equal to the reference voltage ($V_{ref}$). Capacitor 420 ($C_4$) and amplifier 418 form an integrator stage (referred to as $C_4$ integrator stage), which controls the resistance of $R_{Vm}$, and enforces this condition through negative feedback. The $C_4$ integrator stage output voltage only changes when there is a nonzero input error current equal to:

$$I_{error} = V_{ref}/R_{Vm} - I_{ref} \quad (4)$$

The error current reaches a value of zero as a desired condition, e.g. $V_{ref}/R_{Vm} = I_{ref}$ is reached. It should be noted again that the objective is to keep the main signal path gain controlling resistance 412 ($R_{Vr}$) constant with respect to changes in temperature. When resistors 412 ($R_{Vr}$) and 416 ($R_{Vm}$) are designed to be identical to one another, and $R_{Vr}$ is slaved to $R_{Vm}$, keeping $R_{Vm}$ constant with respect to changes in temperature ensures that $R_{Vr}$ is also kept constant with respect to changes in temperature. As mentioned above, resistors (resistances) 412 and 416 may be implemented using MOS devices, and when identical resistances are desired, the two respective MOS devices may be designed as two identical or near-identical MOS devices.

Figure 6:
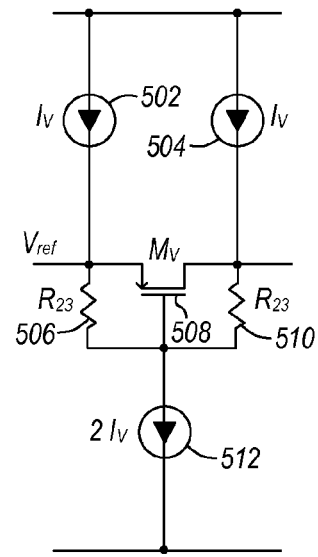
FIG. 6 shows the circuit model of one embodiment of the variable resistor, using a MOS device.
Figure 7:
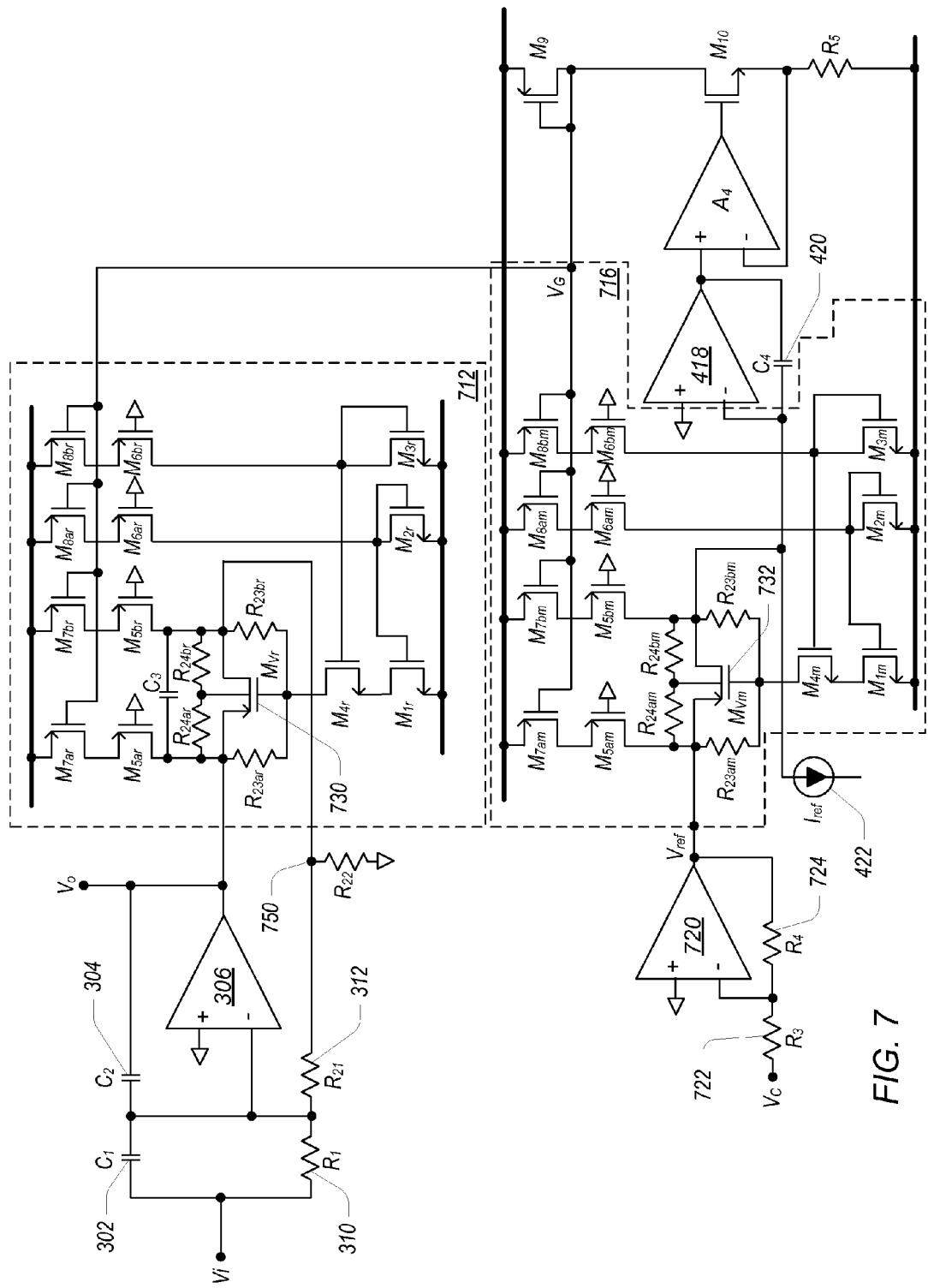
FIG. 7 shows the circuit model of one embodiment of the front-end circuit and control circuit of FIG. 5 implemented with MOS devices.

A partial circuit block diagram of one embodiment of a variable resistance element used in implementing TVR 412 and TVR 416 is shown in FIG. 6. The drop voltage across resistances 506 and 510 (each represented having a value of $R_{23}$) produced by currents 502 and 504, respectively (each having a value of $I_v$) develops an equal voltage across the source-gate and drain-gate terminals of transistor device 508 (i.e. $V_{GS} = V_{DS}$), with a total current 512 (value of $2*I_v$) flowing from the node coupled to the gate of transistor device 508. This ensures that $V_{DS}$ of transistor device 508 ($M_V$) is kept small enough to operate transistor device 508 in linear mode. A more detailed schematic circuit diagram of one embodiment of the circuit of FIG. 5 and FIG. 6 is shown in FIG. 7. The reference voltage $V_{ref}$ is provided by a reference circuit that includes amplifier 720, and resistors 722 and 724. The value $V_{ref}$ may be expressed by the equation:

$$V_{ref} = -V_C(R_4/R_3).$$

Drain-source voltages ($V_{DS}$) of MOS transistors 732 ($M_{Vm}$) and 730 ($M_{Vr}$) may be kept small enough to operate transistors 732 and 730 in linear mode. Meanwhile, $V_{GS,Vm}$ as well $V_{GS,Vr}$ (that is, the respective gate-source voltages of transistors 732 and 730) may be kept constant to ensure a constant channel resistance. The gate of transistor 732 is connected to the drain and source terminals using resistors $R_{23am}$ and $R_{23bm}$, and likewise the gate of transistor 730 is connected to the drain and source terminals using resistors $R_{23ar}$ and $R_{23br}$, respectively. The drain currents of transistors $M_{7ar}$, $M_{7br}$, $M_{7am}$, and $M_{7bm}$ produce a fixed voltage drop across resistors $R_{23ar}$, $R_{23br}$, $R_{23am}$ and $R_{23bm}$ ($R_{23ar} = R_{23br} = R_{23am} = R_{23bm}$) respectively. Changing the drain currents of transistors $M_{7ar}$, $M_{7br}$, $M_{7am}$, and $M_{7bm}$ varies the respective $V_{GS}$ values of 730 and 732, which results in the adjustment of the channel resistivity of transistors 730 and 732.

The current through $R_5$ is mirrored in transistors $M_{7ar}$, $M_{7br}$, $M_{7am}$, and $M_{7bm}$ and transistors $M_{8ar}$, $M_{8br}$, $M_{8am}$, and $M_{8bm}$. As shown in FIG. 7, the drain current of transistor $M_{8ar}$ is mirrored through $M_{1r}$-$M_{2r}$, and likewise, the drain current of transistor $M_{8am}$ is mirrored through $M_{1m}$-$M_{2m}$. Current mirrors that include transistors $M_{8ar}$, $M_{8br}$, $M_{7ar}$, $M_{7br}$ and $M_9$, and current mirrors that include transistors $M_{1r}$, $M_{2r}$, $M_{3r}$, and $M_{4r}$ ensure that the drain current in transistor $M_{4r}$ is twice the value of the respective drain currents of transistors $M_{7ar}$ and $M_{7br}$. In the same way, the drain current of transistor $M_{4m}$ has a value twice that of the drain respective drain currents of transistors $M_{7am}$ and $M_{7bm}$. Having long channel-length transistors $M_{1r}$ and $M_{4r}$ in a cascode configuration may improve linearity performance when a high output voltage swing is present at $V_O$ (and high swing voltage in the gate of transistor 730). Meanwhile, having transistors $M_{5ar}$ and $M_{7ar}$ in a cascode configuration, and having transistors $M_{5br}$ and $M_{7br}$ in a cascode configuration provides for matching transistors $M_{7br}$, $M_{7ar}$ and $M_9$, and improves linearity performance (of the variable resistance) when there is a high voltage swing at $V_O$. The linearity performance may be further improved by connecting the bulk terminals of transistors 730 and 732 to the drain and the source terminals using resistors $R_{24ar}$, $R_{24br}$, $R_{24am}$ and $R_{24bm}$, respectively.

It is worth noting that the parasitic capacitance between node 750 and ground may have a small impedance at very high frequencies. Therefore, when there is a high output voltage swing at $V_O$, the drain-source voltage of the slave MOS transistor 730 ($V_{DS,Vr}$) may also experience a high voltage swing. As result, transistor 732 may operate as a nonlinear device and produce DC drifting. Therefore, in one set of embodiments, in order to reduce such DC drifting, capacitor $C_3$ may be placed between the drain and source terminals of the slave MOS transistor 730. The value of $C_3$ may be defined by linearity specifications and the estimated parasitic capacitance assigned on node 750. While the embodiment shown in FIG. 7 includes capacitor $C_3$, embodiments without capacitor $C_3$ may equally operate to provide a compensated temperature variable resistance as described herein. The embodiment shown in FIG. 7 includes PMOS transistor devices used as the variable resistors. In alternate embodiments, NMOS transistor devices may equally be used as the variable resistors. In that case, transistors $M_{10}$, $M_{1r}$, $M_{2r}$, $M_{3r}$, and $M_{4r}$, and $M_{1m}$, $M_{2m}$, $M_{3m}$ and $M_{4m}$ may all be PMOS transistors, and all other transistors, $M_{5r}$-$M_{8r}$, $M_{5m}$-$M_{8m}$, and $M_9$ may be NMOS transistors.

Although the embodiments above have been described in considerable detail, numerous variations and modifications will become apparent to those skilled in the art once the above disclosure is fully appreciated. It is intended that the following claims be interpreted to embrace all such variations and modifications.

We claim:

1. A resistance circuit comprising:
   a first transistor device configured to operate in linear mode, and having an operative resistance value representative of a specified nominal resistance value;
   a second transistor device having device characteristics commensurate with characteristics of the first transistor device, wherein the second transistor device is configured to operate in linear mode, and have an operative resistance value representative of the specified nominal resistance value; and
   control circuitry configured to:
      cause the operative resistance value of the second transistor device to return to the specified nominal resistance value when the operative resistance value of the second transistor device drifts away from the specified nominal resistance value due to changes in temperature; and
      control the first transistor device by a control signal generated according to operation of the second transistor device, causing the operative resistance value of the first transistor device to return to the specified nominal resistance value when the operative resistance value of the first transistor device drifts away from the specified nominal resistance value due to changes in temperature.

2. The resistance circuit of claim 1, wherein to cause the operative resistance value of the second transistor device to return to the specified nominal resistance value, the control circuit is configured to adjust a gate-source bias voltage of the second transistor device.

3. The resistance circuit of claim 1, wherein the operative resistance value of the second transistor device is determined by a ratio of a reference voltage and a reference current applied at respective terminals of the second transistor device.

4. The resistance circuit of claim 1, wherein during an equilibrium condition, a drop voltage produced across the second transistor device by a reference current equals a reference voltage applied to a channel terminal of the second transistor device.

5. The resistance circuit of claim 4, wherein the control circuit comprises an integrator stage configured to enforce the equilibrium condition through negative feedback to the second transistor device.

6. The resistance circuit of claim 5, wherein the integrator stage is configured to adjust a gate-source bias voltage of the second transistor device when an input error current into the integrator stage reaches a specified value.

7. The resistance circuit of claim 6, wherein the specified value of the error current equals $(V_{ref}/R_{Vm})-I_{ref}$;
   wherein $V_{ref}$ is the value of the reference voltage;
   wherein $R_{Vm}$ is the specified nominal resistance value; and
   wherein $I_{ref}$ is the value of the reference current.

8. A method for compensating a DC (Direct Current) gain in a front-end circuit, the method comprising:
   operating a first transistor device of the front-end circuit in linear mode, wherein the first transistor device has an operative resistance value representative of a specified nominal resistance value, and is configured in a feedback path of an inverting amplifier circuit of the front-end circuit;
   operating a second transistor device of the front-end circuit in linear mode, wherein the second transistor device has an operative resistance value representative of the specified nominal resistance value;
   causing the operative resistance value of the second transistor device to return to the specified nominal resistance value when the operative resistance value of the second transistor device drifts away from the specified nominal resistance value due to changes in temperature; and
   causing the operative resistance value of the first transistor device to return to the specified nominal resistance value when the operative resistance value of the first transistor device drifts away from the specified nominal resistance value due to changes in temperature, comprising controlling the first transistor device by a control signal generated based on operation of the second transistor device.

9. The method of claim 8, wherein said causing the operative resistance value of the second transistor device to return to the specified nominal resistance value comprises adjusting a gate-source bias voltage of the second transistor device.

10. The method of claim 8, further comprising setting the operative resistance value of the second transistor device by applying a reference current and a reference voltage at respective terminals of the second transistor device, wherein the operative resistance value of the second transistor device is determined by a ratio of the reference voltage and the reference current 11. The method of claim 8, further comprising:
   producing, by a reference current, a drop voltage across the second transistor device; and
   applying a reference voltage to a channel terminal of the second transistor device;
   wherein during an equilibrium condition, the drop voltage equals the reference voltage.

12. The method of claim 11, further comprising enforcing the equilibrium condition through an integrating, negative feedback path to the second transistor device.

13. The method of claim 12, wherein said enforcing the equilibrium condition comprises adjusting a gate-source bias voltage of the second transistor device when an error current into the integrating, negative feedback path reaches a specified value.

14. A front-end circuit comprising:
an amplifier having a first input, a second input, and an output; and
a resistor network having a pair of terminals respectively coupled to the first input of the amplifier and the output of the amplifier, wherein the resistor network defines a DC (Direct Current) gain of the front-end circuit, wherein the resistor network comprises a first transistor device coupled to the output of the amplifier and configured to:
operate in linear mode, having an operative resistance value representative of a specified nominal resistance value; and
adjust its operative resistance value to return to the specified nominal resistance value responsive to a control signal, when the operative resistance value of the first transistor device drifts away from the specified nominal resistance value due to changes in temperature.

15. The front-end circuit of claim 14, further comprising a capacitor network having three terminals respectively coupled to an input of the front-end circuit, the output of the amplifier, and the first input of the amplifier, wherein the capacitor network defines an AC (Alternating Current) gain of the front-end circuit.

16. The front-end circuit of claim 15, wherein the capacitor network comprises:
a first capacitor coupled across the input of the front-end circuit and the first input of the amplifier; and
a second capacitor coupled across the first input of the amplifier and the output of the amplifier;
wherein the AC gain is determined by a ratio of the first capacitor and the second capacitor.

17. The front-end circuit of claim 14, further comprising:
a second transistor device configured to operate in linear mode, having an operative resistance value representative of the specified nominal resistance value; and
an integral loop controller configured around the second transistor device, and further configured to;
adjust the operative resistance value of the second transistor device to return to the specified nominal resistance value when the operative resistance value of the first transistor device drifts away from the specified nominal resistance value due to changes in temperature; and
generate the control signal according to adjustments made to the operative resistance value of the second transistor device.

18. The front-end circuit of claim 17, wherein in adjusting the operative resistance value of the second transistor device, the integral loop controller is configured to adjust a gate to source bias voltage of the second transistor device.

19. The front-end circuit of claim 17, wherein the specified nominal resistance value is determined by a value of a current reference applied to the second transistor device, and a value of a reference voltage applied to the second transistor device.

20. The front-end circuit of claim 17, wherein the integral loop controller is configured to adjust a value of the control signal when an input error current in the integral loop controller reaches a specified value.

* * * * *